US009713279B2

(12) United States Patent
Tseng et al.

(10) Patent No.: US 9,713,279 B2
(45) Date of Patent: Jul. 18, 2017

(54) FRONT ACCESS SERVER

(71) Applicant: Quanta Computer Inc., Tao Yuan Shien (TW)

(72) Inventors: Chen Tseng, Tao Yuan Shien (TW); Chao-Jung Chen, Tao Yuan Shien (TW); Yaw-Tzorng Tsorng, Tao Yuan Shien (TW); Chi-Fu Chen, Tao Yuan Shien (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 14/585,307

(22) Filed: Dec. 30, 2014

(65) Prior Publication Data
US 2016/0192532 A1 Jun. 30, 2016

(51) Int. Cl.
G06F 1/16 (2006.01)
H05K 7/00 (2006.01)
H05K 7/14 (2006.01)

(52) U.S. Cl.
CPC .................. H05K 7/1487 (2013.01)

(58) Field of Classification Search
None
See application file for complete search history.

(56) References Cited

U.S. PATENT DOCUMENTS

2002/0094706 A1* 7/2002 Britton ............... H01R 12/7082
439/74
2005/0286235 A1* 12/2005 Randall ............... H05K 7/1492
361/724
2006/0041783 A1* 2/2006 Rabinovitz .......... G11B 33/128
714/6.12
2007/0211430 A1* 9/2007 Bechtolsheim .... H05K 7/20736
361/695
2008/0201515 A1* 8/2008 Birgin ................. G06F 13/409
710/313
2009/0152216 A1* 6/2009 Champion ............ G06F 1/183
211/26
2010/0008038 A1* 1/2010 Coglitore ................ G06F 1/20
361/679.48
2010/0049893 A1* 2/2010 Drako .................. G06F 13/409
710/301
2010/0134989 A1* 6/2010 Strmiska .............. H05K 7/1418
361/759

(Continued)

*Primary Examiner* — Courtney Smith
*Assistant Examiner* — Rashen E Morrison
(74) *Attorney, Agent, or Firm* — Nixon Peabody LLP; Zhou Lu

(57) ABSTRACT

An apparatus configured such that hardware components of a server can be accessed from the front of the server. The apparatus comprises a server tower having a front side, a rear side, and at least one chassis. The chassis comprises a motherboard and at least one hard drive housed in the chassis at the front side, the hard drive adapted to be spaced apart above the motherboard. A bracket can support the hard drive. The motherboard I/O and the hard drive are accessible from the front side. The hard drive can be configured in the apparatus such that the hard drive is removable and hot-swappable. The apparatus can comprise at least one coupling port used to couple peripheral devices located at the front side. The apparatus can comprise a front panel attached to the front side through which the at least one coupling port can be accessed.

20 Claims, 4 Drawing Sheets

(56) References Cited

U.S. PATENT DOCUMENTS

| | | | | |
|---|---|---|---|---|
| 2010/0318708 A1* | 12/2010 | Castiel | ............... | G06F 13/409 710/301 |
| 2011/0090633 A1* | 4/2011 | Rabinovitz | ............ | G06F 1/184 361/679.31 |
| 2012/0026668 A1* | 2/2012 | Landon | ................ | G06F 1/184 361/679.31 |
| 2012/0069514 A1* | 3/2012 | Ross | ............... | H05K 7/20727 361/679.33 |
| 2012/0151098 A1* | 6/2012 | Sullivan | ............ | G06F 1/1607 710/13 |
| 2013/0141863 A1* | 6/2013 | Ross | ................ | G11B 33/128 361/679.33 |
| 2015/0169490 A1* | 6/2015 | Roberts | ............. | H05K 7/1498 710/301 |

* cited by examiner

FRONT ACCESS SERVER

TECHNICAL FIELD

The disclosure generally relates to front access server configurations.

BACKGROUND

Traditional server design places cables and I/O ports and other connectors (e.g., power connector) at the back of a server. Traditional server design also includes cooling fans that pull cool air in from the front of the server and push hot air out of the back of the server. The primary drawback to such a design is that when server maintenance needs to be done, the server administrator must enter the hot air (e.g., hot aisle) at the rear of the server to access the cables, ports, etc., which can be uncomfortable and inconvenient. Additionally, visibility is low, and space to operate is limited at the rear of the server. All of these factors contribute to a less than ideal working environment at the rear of the server for the server administrator when server maintenance must be performed.

SUMMARY

In some implementations, an apparatus can be configured such that hardware components of a server can be accessed from the front of the server. The apparatus can comprise a server tower comprising a front side, a rear side and at least one chassis, the at least one chassis comprising a motherboard housed in the chassis at the front side, and/or at least one hard drive housed at the front side and adapted to be spaced apart above the motherboard. For example, a bracket can support the hard drive such that the hard drive floats above the motherboard and both the motherboard I/O and the hard drive are accessible from the front of the server. The hard drive can be configured in the apparatus such that the hard drive is removable and hot-swappable. The apparatus can further comprise a plurality of computing components, each computing component comprising at least one coupling port located at the front side. The at least one coupling port can comprise a plurality of ports used to couple peripheral devices (e.g., USB, PCI-e, power port, VGA, mezzanine ports, communication ports, etc.). In some implementations, the apparatus can comprise a front panel attached to the front side through which the at least one coupling port can be accessed.

Particular implementations provide at least the following advantages: convenient front side access to coupling ports of a server for maintenance purposes; and server administrators do not have to enter the hot air at the back of the server to perform server maintenance.

Details of one or more implementations are set forth in the accompanying drawings and the description below. Other features, aspects, and potential advantages will be apparent from the description and drawings, and from the claims.

DESCRIPTION OF DRAWINGS

Like reference symbols in the various drawings indicate like elements.

DETAILED DESCRIPTION

Figure 1:
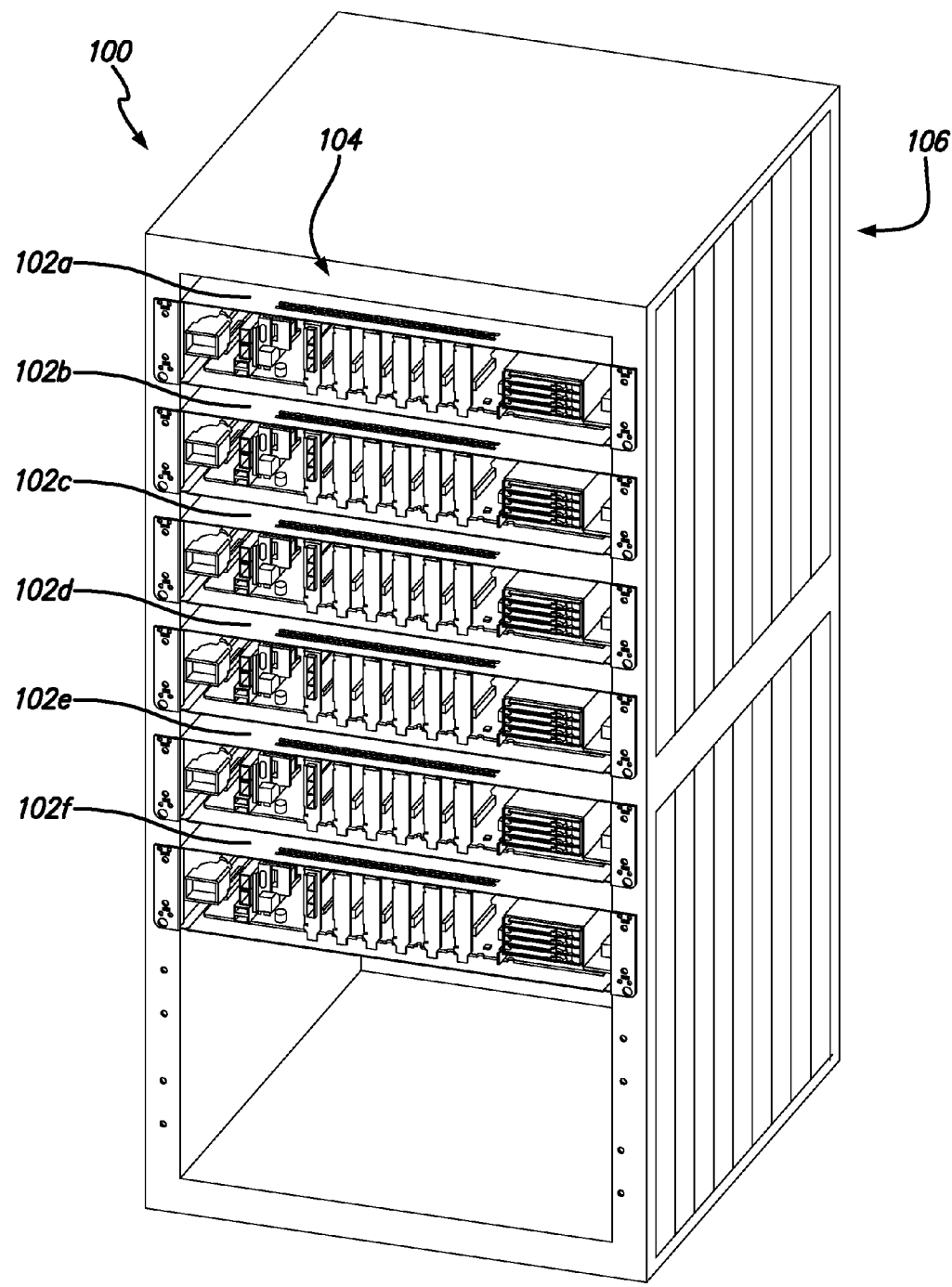
FIG. 1 is an isometric view of an apparatus for providing front side access to a server showing a server tower housing a plurality of chasses.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and members have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening members, and is not necessarily limited to physical connections. The connection can be such that the objects are permanently connected or releasably connected. The term "substantially" is defined to be essentially conforming to the particular dimension, shape or other word that substantially modifies, such that the member need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

FIG. 1 illustrates an example apparatus 100 for providing front side access to a server. In some implementations, apparatus 100 can be a server tower. For example, the server tower can be for an application server, a web server, a mail server, a mobile server, a file server, and/or a rack mounted server, etc. Apparatus 100 can be made of metal, plastic, alloys, etc.

In some implementations, apparatus 100 can comprise front side 104, rear side 106, and chasses 102a-102f. For example, front side 104 can correspond to the side of apparatus 100 where cold air enters each chassis 102a-102f. Rear side 106 can correspond to the side of apparatus 100 where hot air exits each chassis 102a-102f.

In some implementations, apparatus 100 can be adapted to house at least one chassis (e.g., chassis 102a). For example, chasses 102a-102f can attach to the sides of apparatus 100 according to means well known in the art, including, but not limited to, screws, welding, glue, nails, friction fit, snap fit, etc. In some implementations, apparatus 100 can comprise trays and/or shelves as known in the art that attach to chasses 102a-102f for facilitating access to chasses 102a-102f. For example, chasses 102a-102f can be accessed by sliding out on a tray or shelf for access to chasses 102a-102f for installing and uninstalling purposes. Each chassis 102a-102f can be adapted to house a plurality of computing components (e.g., server components) on front side 104, as described below.

Having the plurality of computing components of each chassis 102a-102f located on front side 104 provides convenient access to the coupling ports of the server components for maintenance purposes. Thus, server administrators do not have to enter the hot air at rear side 106 of the server to perform server maintenance. Instead, server administrators can perform maintenance from front side 104, where there is more light and cool air.

Figure 2:
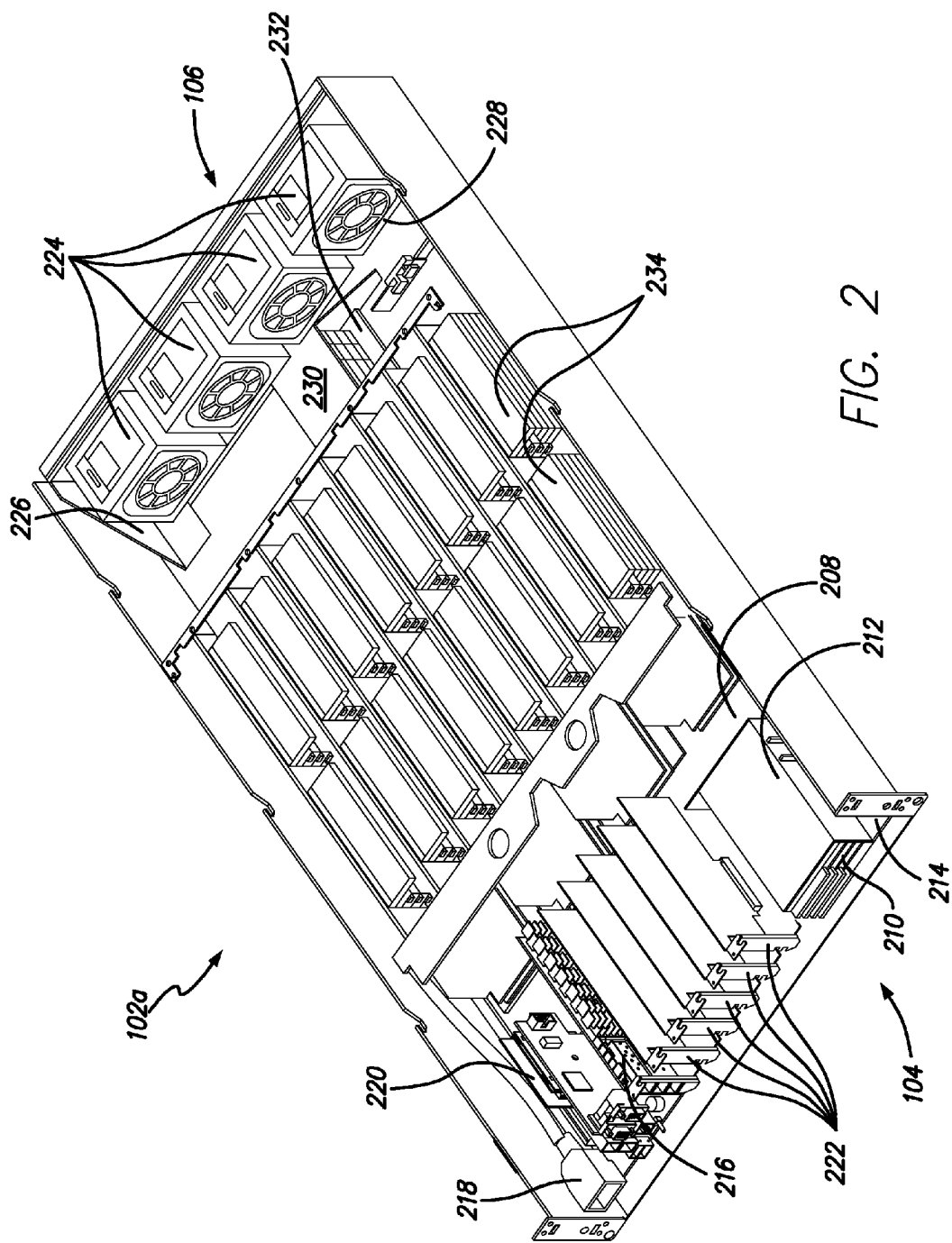
FIG. 2 is an isometric view of a chassis of FIG. 1 showing the location and placement of computing components within the chassis.

FIG. 2 illustrates an example chassis 102a of apparatus 100 for providing front side access to a server. Although only chassis 102a is described, it is understood that chasses 102a-102f can each be configured according to a combination of the following description.

In some implementations, chassis 102a can be made of metal, plastic, alloys, etc., and shaped like a box. For example, chassis 102a can be shaped according to standard heights and widths for a server (e.g., 1 U, 2 U, etc.). Chassis 102a can be adapted to house a plurality of server components.

In some implementations, motherboard 208 can be configured in chassis 102a such that various connectors of motherboard 208 can be accessed from front side 104 of apparatus 100. For example, the connectors of motherboard 208 can comprise sockets (e.g., for a CPU), memory slots, power connectors, floppy drive connectors, IDE connectors, SATA connectors, PCI slots, PCI-e slots, and connectors for integrated peripherals (e.g., PS/2 keyboard, mouse, serial port, parallel port, VGA, firewire/IEEE 1394a, USB, Ethernet, audio, etc.). In some implementations, motherboard 208 can be installed at front side 104 of apparatus 100 such that the motherboard connectors and various computing components that couple to the motherboard connectors can be accessed from front side 104. In some implementations, the various connectors can be located on motherboard 208 such that the connectors are closer to front side 104 when motherboard 208 is installed at front side 104. For example, motherboard 208 can be installed at front side 104 of apparatus 100 such that the USB, Ethernet, PS/2, VGA, and other such I/O connectors are located at front side 104 of apparatus 100. Motherboard 208 can comprise any printed circuit board (PCB) known in the art.

In some implementations, at least one hard drive 210 can be coupled to motherboard 208 (e.g., at the SATA connector) such that hard drive 210 is housed on front side 104 and can be accessed from the front of chassis 102a. Hard drive 210 can be any type of hard disk drive (HDD) known in the art, including, but not limited to, PATA, SATA, SCSI, SSD, internal, external, etc. In some versions, hard drive 210 can be removable. In other versions, hard drive 210 can be hot-swappable such that hard drive 210 can be removed while apparatus 100 is powered on. In some versions, a plurality of hard drives 210 can be supported at front side 104 of apparatus 100. The plurality of hard drives 210 can be arranged on top of one another (i.e., stacked), or side-by-side, according to methods known in the art. In some versions, due to spacing limitations, motherboard 208 can take up the full width of front side 104 leaving very little room for other components of the server at front side 104 of apparatus 100. To accommodate both motherboard 208 and hard drive 210 at front side 104 of apparatus 100, in some implementations, hard drive 210 can be adapted to be spaced apart from and sit above motherboard 208. For example, hard drive 210 can be coupled to bracket 212 for holding hard drive 210 above motherboard 208. Bracket 212 can be configured so that hard drive 210 sits above and is spaced apart from motherboard 208. Bracket 212 can be made of metal, plastic, alloys, and the like, and can couple to hard drive 210 according to any means, including, but not limited to, friction fit, snap fit, screws, glue, etc., for example. Bracket 212 can be attached to chassis 102a according to any means, including, but not limited to, welding, screws, nails, glue, snap fit, friction fit, etc.

In some implementations, bracket 212 can comprise shelf 214 for supporting hard drive 210. Shelf 214 can be adapted to support hard drive 210 from directly underneath hard drive 210 according to methods well-known in the art (not shown), or from the side (FIG. 2). An advantage of supporting hard drive 210 from the side is that it allows for the hard drive 210 to be spaced apart from chassis 102a so that there is room for wires or other components along chassis 102a. In some implementations, bracket 212 can be a hard drive box.

In some implementations, chassis 102a can be adapted to house I/O board 216 such that I/O board 216 can be accessed from front side 104 of apparatus 100. I/O board 216 can comprise any network relay module known in the art that has various input and output ports (e.g., PS/2, USB, audio, VGA, etc.). I/O board 216 can be coupled to motherboard 208 (e.g., at a connector) such that the various input and output ports of I/O board 216 are located at front side 104 of apparatus 100 and can be accessed from front side 104.

In some implementations, power 218 can be located at front side 104 of apparatus 100 such that power 218 can be accessed from the front of chassis 102a. Power 218 can be any power supply known in the art (e.g., according to Advanced Technology eXtended (ATX) specifications) for coupling motherboard 208 to a power source (e.g., AC power supply). Power 218 can be coupled to motherboard 208 at a connector (e.g., ATX power connector) such that power 218 is located at front side 104 of apparatus 100. Power 218 can comprise a power supply unit (PSU) for converting AC power to DC power for the computing components coupled to motherboard 208.

In some implementations, mezzanine cards 220 can be located at front side 104 of apparatus 100 such that mezzanine cards 220 can be accessed from the front of chassis 102a. Mezzanine cards 220 can comprise any PCI mezzanine card (PMC) known in the art. Mezzanine cards 220 can be coupled to motherboard 208 (e.g., at the FCI 61082-121402LF connector) such that several mezzanine cards 220 are parallel to each other at front side 104. Mezzanine cards 220 can comprise mezzanine couplings, which are also accessible from front side 104. In some versions, mezzanine cards 220 can be used with Open Compute Project (OCP) Intel v2.0 motherboards. In some versions, mezzanine cards 220 can comprise a plurality of indicator lights (e.g., LED lights) to show the status of mezzanine ports. By locating mezzanine cards 220 at front side 104, the indicator lights can be easily discerned.

In some implementations, peripheral component interconnect express (PCI-e) cards 222 (e.g., sound cards, network cards, serial cards, internal modems, video cards, etc.) can be located at front side 104 of apparatus 100 such that PCI-e cards 222 can be accessed from the front of chassis 102a. PCI-e cards 222 can be coupled to motherboard 208 (e.g., at PCI-e slot) such that PCI-e cards 222 are at front side 104 of apparatus 100. In some implementations, PCI-e cards 222 can comprise PCI-e couplings (e.g., Ethernet, USB, VGA, etc.) that are accessible from front side 104 of apparatus 100.

In some implementations, a combination of the above-listed computing components can be arranged such that they couple to motherboard 208 at front side 104 of apparatus 100 so that the various computing components, and their corresponding coupling ports, can be conveniently accessed from front side 104. For example, a plurality of hard drives 210 can be arranged to float on top of motherboard 208 such that hard drives 210 are spaced apart from motherboard 208 on front side 104. At the same time, I/O board 216, power coupling 218, mezzanine cards 220, and PCI-e cards 222 can be arranged at front side 104 along with hard drives 210 and coupled to motherboard 208 such that their corresponding coupling ports can be accessed from front side 104. The specific arrangement of these computing components can be in any order so long as they are all accessible from front side 104 and located at the front side of chassis 102*a*.

By having the above-listed computing components arranged at front side 104 of apparatus 100, not only is it easier to access the coupling ports, but it is also easier to replace and/or diagnose the computing components for errors. For example, if a hard drive fails, it can be easily replaced from the front with a new hard drive without having to go to the back of the server.

In some implementations, computing components having coupling ports used for diagnostic or maintenance purposes, or are commonly used, are housed at front side 104 of apparatus 100 for convenience. For example, coupling ports can include any type of coupling port known in the art, including, but not limited to, universal serial bus (USB), PCI-e, power port, video graphics array (VGA), communications, mezzanine card ports, etc.

Alternatively, chassis 102*a* can house any computing component used in a server, including, but not limited to, fans 224, fan cage 226, fan power board 228, power supply unit (PSU) 230, program database (PDB) 232, dual in-line memory modules (DIMMs) 234, etc. These computing components can be housed within chassis 102*a* or at rear side 106. In some versions, fans 224, fan cage 226, and fan power board 228 are located at rear side 106. This is for optimal cooling effect on the computing components housed within chassis 102*a*. Fans 224 can be any type of fan known in the art used for cooling a server. In some versions, fans 224 create a cooling effect on the computing components of chassis 102*a* by pulling in cool air from front side 104, and blowing hot air out from rear side 106.

Figure 3:
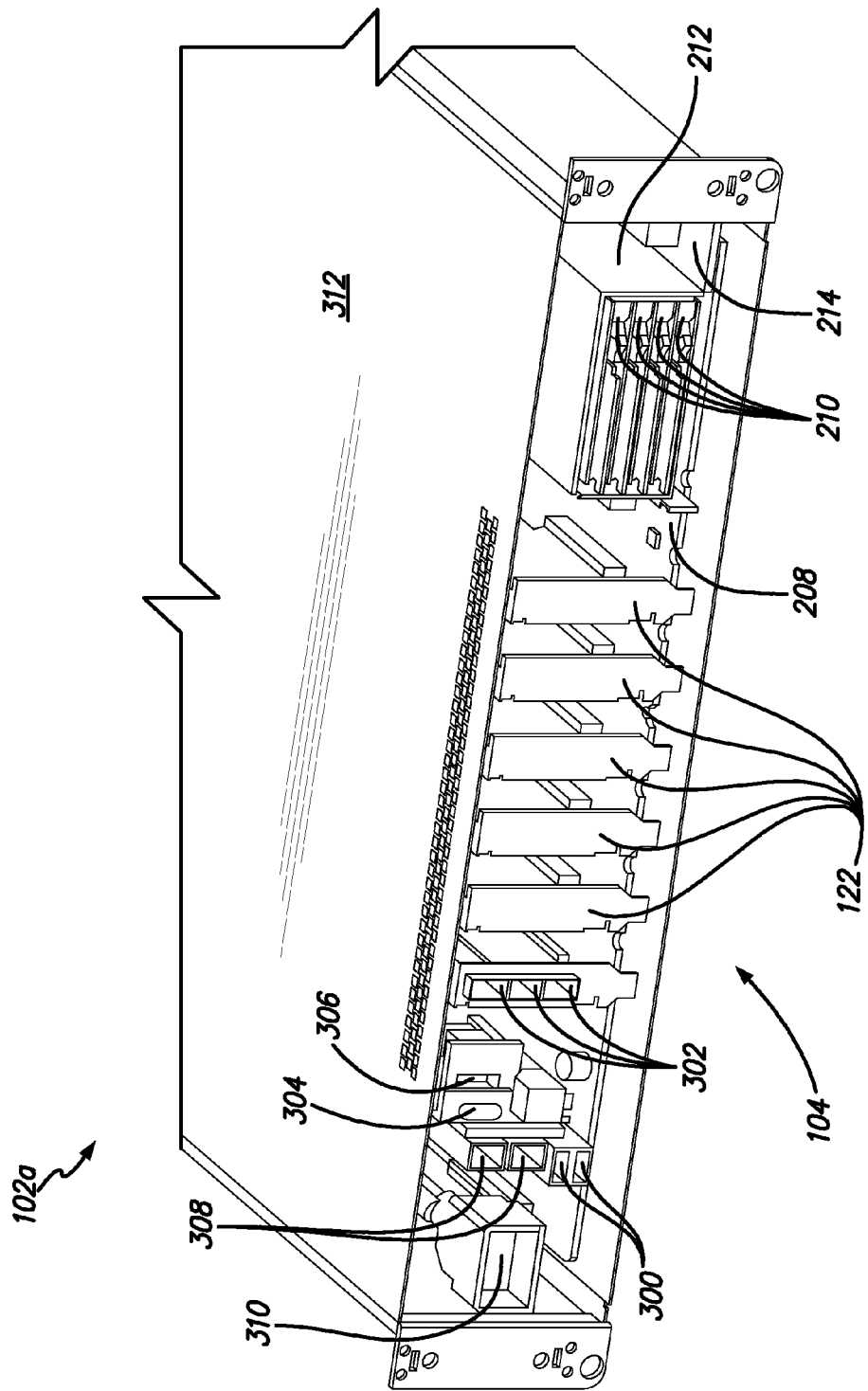
FIG. 3 is a front view of the chassis of FIG. 2.

FIG. 3. illustrates a front view of chassis 102*a* for providing front side access to server components. For example, chassis 102*a* can include a plurality of computing components and coupling ports located on front side 104 of apparatus 100. Coupling ports such as USB 300, PCI-e 302, VGA 304, communications 306, mezzanine couplings 308, power coupling 310, etc. are located on front side 104 for convenient access.

In some implementations, USB 300 can comprise multiple USB ports located on front side 104 above one another, or side-by-side according to means known in the art. USB 300 can be used to couple various external devices to chassis 102*a* for maintenance and/or diagnostic purposes. For example, an administrator can couple a diagnostic device to USB 300 for use in diagnosing a server for errors.

In some implementations, PCI-e 302 can comprise multiple PCI-e ports located on front side 104 of apparatus 100. PCI-e 302 can be used for coupling to various external devices for use in maintenance and/or diagnostic purposes. For example, an administrator can couple a diagnostic device to PCI-e 302 for use in diagnosing a server for errors.

In some implementations, VGA 304 can comprise multiple video input and output ports located on front side 104 of apparatus 100. VGA 304 can be used to couple a display to chassis 102*a* for maintenance and/or diagnostic purposes. For example, a network administrator can couple a monitor to the server to view diagnostic information about the server on a screen. In other versions, various types of video input/output can be used, including, but not limited to, HDMI, DVI, S-Video, AV, etc.

In some implementations, mezzanine card ports 308 can comprise multiple mezzanine card ports located on front side 104 of apparatus 100. Mezzanine card ports 308 can be used to couple various external devices for use in maintenance and/or diagnostic purposes. For example, an administrator can couple a diagnostic device to mezzanine card ports 308 for use in diagnosing a server for errors.

In some implementations, power 218 can comprise power coupling 310. Power coupling 310 can be located on front side 104 of apparatus 100 so that motherboard 208 can easily be coupled to a power source. For example, a server can quickly be coupled and decoupled from a power source for booting up and/or resetting purposes.

In some versions, chassis cover 312 can be attached to chassis 102*a* to cover, conceal, and protect the computing components from external conditions. Chassis cover 312 can comprise the same material as chassis 102*a*, including, but not limited to, metal, plastic, alloys, etc.

Figure 4:
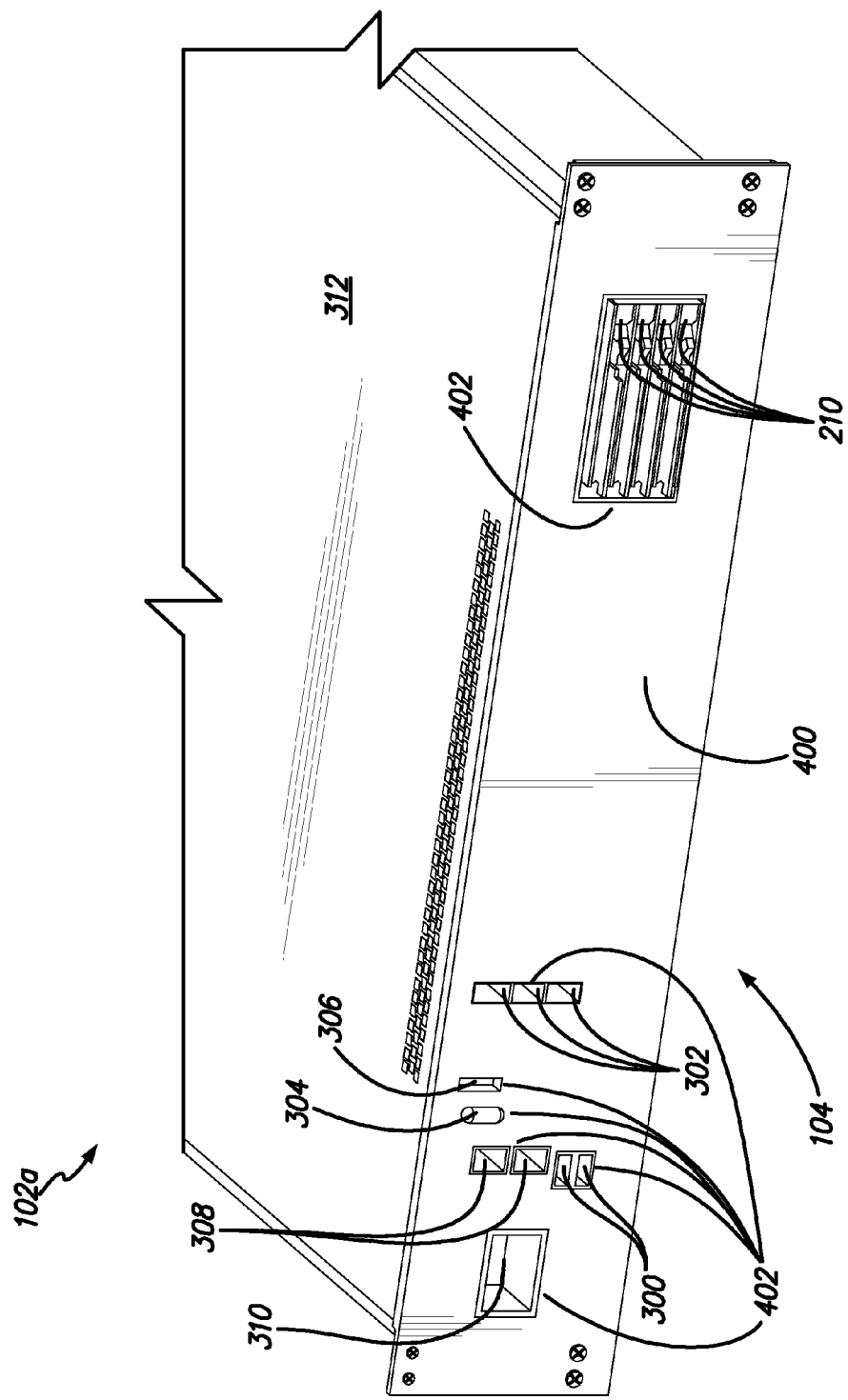
FIG. 4 is a front view of a front panel through which various components of the front access server can be accessed.

FIG. 4 illustrates a front panel through which various components of the front access server can be accessed. In some implementations, front panel 400 can be used for covering the front side of chassis 102*a*. For example, front panel 400 can comprise a plurality of apertures 402 through which the plurality of coupling ports 300, 302, 304, 306, 308, at least one hard drive 210, and power coupling 310 can be accessed. In some versions, apertures 402 can be adapted to match the shape and size of the plurality of coupling ports 300, 302, 304, 306, 308, at least one hard drive 210, and power coupling 310. For example, apertures 402 can be rectangular, circular, ovular, square, etc. Front panel 400 can be secured to chassis 102*a* according to methods known in the art. For example, front panel 400 can be snap fit, friction fit, screwed on, glued, welded, etc. to chassis 102*a*. Additionally, front panel 400 can be adapted to be removable from chassis 102*a*. For example, front panel 400 can comprise a hinge so that front panel 400 can swing open and close shut.

In some versions, front panel 400 acts as a barrier to cover, conceal, and protect the computing components from external conditions. Additionally, apertures 402 and 404 can serve the purpose of quickly and easily identifying where the coupling ports are located on front side 104. Front panel 400 can comprise the same material as chassis 102*a*, including, but not limited to, metal, plastic, alloys, etc.

For clarity and simplicity, only a single chassis 102*a* is described. However, it is understood that multiple chasses comprising multiple computing components and multiple coupling ports in various combinations can be supported by the above disclosure. For example, multiple chasses 102*a*-102*f* can be stored on top of each other in a server tower, as commonly known in server architecture, each chassis adapted to have coupling ports located on the front side according to the disclosure herein. Each chassis 102*a*-102*f* can also house a different combination of a plurality of different server components. For example, chassis 102*a* can house a plurality of hard drives, while chassis 102*b* can house a plurality of mezzanine cards.

Although a variety of examples and other information were used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

What is claimed is:

1. An apparatus comprising:
   a server tower comprising a front side and a rear side, the server tower housing at least one chassis, the at least one chassis comprising:
   a motherboard housed in the at least one chassis at the front side;
   at least one computing component board housed in the at least one chassis and coupled to the motherboard, the at least one computing component board having one end located at the front side and comprising at least one coupling port at the one end, the at least one coupling port adapted to couple to one or more peripheral devices; and
   at least one hard drive housed in the at least one chassis at the front side, the at least one hard drive coupled to the motherboard, the at least one hard drive having one end located at the front side to be accessible from the front side;
   wherein the at least one coupling port is disposed on the one end to face and be accessible from the front side.

2. The apparatus of claim 1 wherein the at least one hard drive is adapted to sit above the motherboard such that the at least one hard drive is spaced apart from the motherboard.

3. The apparatus of claim 2 further comprising a bracket, the bracket coupled to the at least one hard drive such that the at least one hard drive sits above and is spaced apart from the motherboard.

4. The apparatus of claim 2 wherein the at least one hard drive is removable.

5. The apparatus of claim 4 wherein the at least one hard drive is adapted to be removed while the motherboard is powered on.

6. The apparatus of claim 2 wherein the at least one hard drive comprises a plurality of hard drives stacked on top of one another.

7. The apparatus of claim 1 wherein the at least one coupling port comprises a plurality of universal serial bus (USB) ports.

8. The apparatus of claim 1 wherein the at least one coupling port comprises a plurality of peripheral component interconnect express (PCI-e) ports.

9. The apparatus of claim 1 wherein the at least one coupling port comprises a power port.

10. An apparatus comprising:
    a server tower comprising a front side and a rear side, the server tower housing at least one chassis, the at least one chassis comprising:
    a motherboard housed in the at least one chassis at the front side;
    at least one hard drive housed in the at least one chassis at the front side and adapted to sit above the motherboard such that the at least one hard drive is spaced apart from the motherboard, the at least one hard drive having one end extending to the front side to be accessible from the front side;
    at least one computing component board coupled to the motherboard, the at least one computing component board comprising at least one coupling port, the at least one computing component board housed in the front side, the at least one coupling port adapted to couple to various peripheral devices from the front side; and
    a front panel attached to the front side of the chassis through which the at least one hard drive and the at least one coupling port can be accessed;
    wherein the at least one coupling port of the at least one computing component board of the server tower are accessible from the front side.

11. The apparatus of claim 10 further comprising a bracket, the bracket coupled to the at least one hard drive such that the at least one hard drive sits above and is spaced apart from the motherboard.

12. The apparatus of claim 11 wherein the bracket comprises a shelf.

13. The apparatus of claim 10 wherein the at least one hard drive is removable.

14. The apparatus of claim 10 wherein the at least one computing component board comprises a power supply unit (PSU).

15. The apparatus of claim 10 wherein the at least one coupling port comprises a power port.

16. The apparatus of claim 10 wherein the at least one hard drive comprises a plurality of hard drives stacked on top of one another.

17. The apparatus of claim 10 wherein the at least one coupling port comprises a management port.

18. The apparatus of claim 10 wherein the at least one coupling port comprises a video graphics array (VGA) port and a communications port.

19. The apparatus of claim 10 wherein the at least one coupling port includes at least one mezzanine card port.

20. The apparatus of claim 10 wherein the at least one coupling port comprises a plurality of peripheral component interconnect express (PCI-e) ports.

* * * * *